United States Patent [19]
Ohwada

[11] Patent Number: 5,929,679
[45] Date of Patent: Jul. 27, 1999

[54] VOLTAGE MONITORING CIRCUIT CAPABLE OF REDUCING POWER DISSIPATION

[75] Inventor: Masakatsu Ohwada, Tokyo, Japan

[73] Assignee: NEC Corporation, Tokyo, Japan

[21] Appl. No.: 08/823,001

[22] Filed: Mar. 21, 1997

[30] Foreign Application Priority Data

Mar. 22, 1996 [JP] Japan ................................. 8-093086

[51] Int. Cl.[6] ........................... H03K 3/037; H03K 5/22
[52] U.S. Cl. ........................... 327/206; 327/77; 327/312
[58] Field of Search .................................. 327/205, 206, 327/68, 74, 72, 73, 77, 310, 312, 313, 323, 334

[56] References Cited

U.S. PATENT DOCUMENTS

| | | | |
|---|---|---|---|
| 4,506,168 | 3/1985 | Uya | 327/206 |
| 4,563,594 | 1/1986 | Koyama | 327/73 |
| 4,859,873 | 3/1989 | O'Shaughnessy et al. | 327/74 |

FOREIGN PATENT DOCUMENTS

| | | |
|---|---|---|
| 53-26175 | 3/1978 | Japan . |
| 56-72522 | 6/1981 | Japan . |
| 62-194732 | 8/1987 | Japan . |
| 63-164526 | 7/1988 | Japan . |
| 63-261168 | 10/1988 | Japan . |
| 1-156674 | 6/1989 | Japan . |
| 3-127512 | 5/1991 | Japan . |
| 4-175666 | 1/1992 | Japan . |
| 6-291640 | 10/1994 | Japan . |
| 7-20165 | 1/1995 | Japan . |

*Primary Examiner*—Toan Tran

[57] ABSTRACT

In a buffering circuit, a CMOS inverter is connected between a node and a ground terminal. A source-follower-type MOS transistor is connected between a power supply terminal and the node, and a approximately definite voltage is applied to a gate of the source-follower-type MOS transistor. A MOS transistor is connected in parallel to the source-follower-type MOS transistor, and an inverted signal of an output signal of the CMOS inverter is applied to a gate of the MOS transistor.

10 Claims, 7 Drawing Sheets

VOLTAGE MONITORING CIRCUIT CAPABLE OF REDUCING POWER DISSIPATION

BACKGROUND OF THE INVENTION

1. Field of the Invention

The present invention relates to a voltage monitoring circuit including a differential amplifier circuit and a buffering circuit formed by complementary metal oxide semiconductor (CMOS) inverters, and more particularly, to the improvement of the buffering circuit.

2. Description of the Related Art

A first prior art voltage monitoring circuit includes a differential amplifier circuit for receiving an analog input voltage and a reference voltage to generate an output voltage, and also includes a buffering circuit formed of two CMOS inverters in series for receiving the output voltage of the differential amplifier circuit to output a digital output voltage. This will be explained later in detail.

In a first stage of the CMOS inverters, if the high level of an input voltage is not sufficiently high, both of a P-channel MOS transistor and an N-channel MOS transistor of the first stage CMOS inverter are in an ON state, so that an ON-On current or a through current flows through the first stage CMOS inverter, which increases the power dissipation.

In order to reduce the above-mentioned through current, the gate lengths of the transistors of the first stage CMOS inverter are made larger, to suppress the current ability of the transistors.

In the first prior art voltage monitoring circuit, if the gate lengths of the transistors are made larger, the sizes of the transistors are increased, which increases the input capacitance of the first stage CMOS inverter. As a result, the response speed is reduced.

In a second prior art voltage monitoring circuit (see JP-A-6-152341), a diode-connected N-channel MOS transistor and a P-channel MOS transistor are connected between a power supply terminal and the first stage CMOS inverter. The P-channel MOS transistor is controlled by the output voltage of the voltage monitoring circuit. That is, when the output voltage is low, the voltage at the power supply terminal is applied to the first stage CMOS inverter. On the other hand, when the output voltage is high, a voltage lower than the voltage at the power supply terminal is applied by the diode-connected MOS transistor to the first stage CMOS inverter. This will also be explained later in detail.

Thus, in the second prior art voltage monitoring circuit, since the gate lengths of the transistors of the first stage CMOS inverter do not need to be larger, the input capacitance of the first stage CMOS inverter can be reduced, which increases the response speed.

In the second prior art voltage monitoring circuit, however, if the voltage at the power supply terminal is too low, a through current may still flow through the first stage CMOS inverter, which increases the power dissipation.

SUMMARY OF THE INVENTION

It is an object of the present invention to provide a buffering circuit capable of cutting a through current independent of a voltage at a power supply terminal.

Another object is to provide a voltage monitoring circuit including such a buffering circuit.

According to the present invention, in a buffering circuit, a CMOS inverter is connected between a node and a ground terminal. A source-follower-type MOS transistor is connected between a power supply terminal and the node, and a reference voltage independent of a voltage at the power supply terminal is applied to a gate of the source-follower-type MOS transistor. A MOS transistor is connected in parallel to the source-follower-type MOS transistor, and an inverted signal of an output signal of the CMOS inverter is applied to a gate of the MOS transistor.

The source-follower-type MOS transistor can generate a voltage independent of the voltage at the power supply terminal or less dependent upon this voltage.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, prior art voltage monitoring circuits will be explained with reference to FIGS. 1, 2, 3 and 4.

Figure 1:
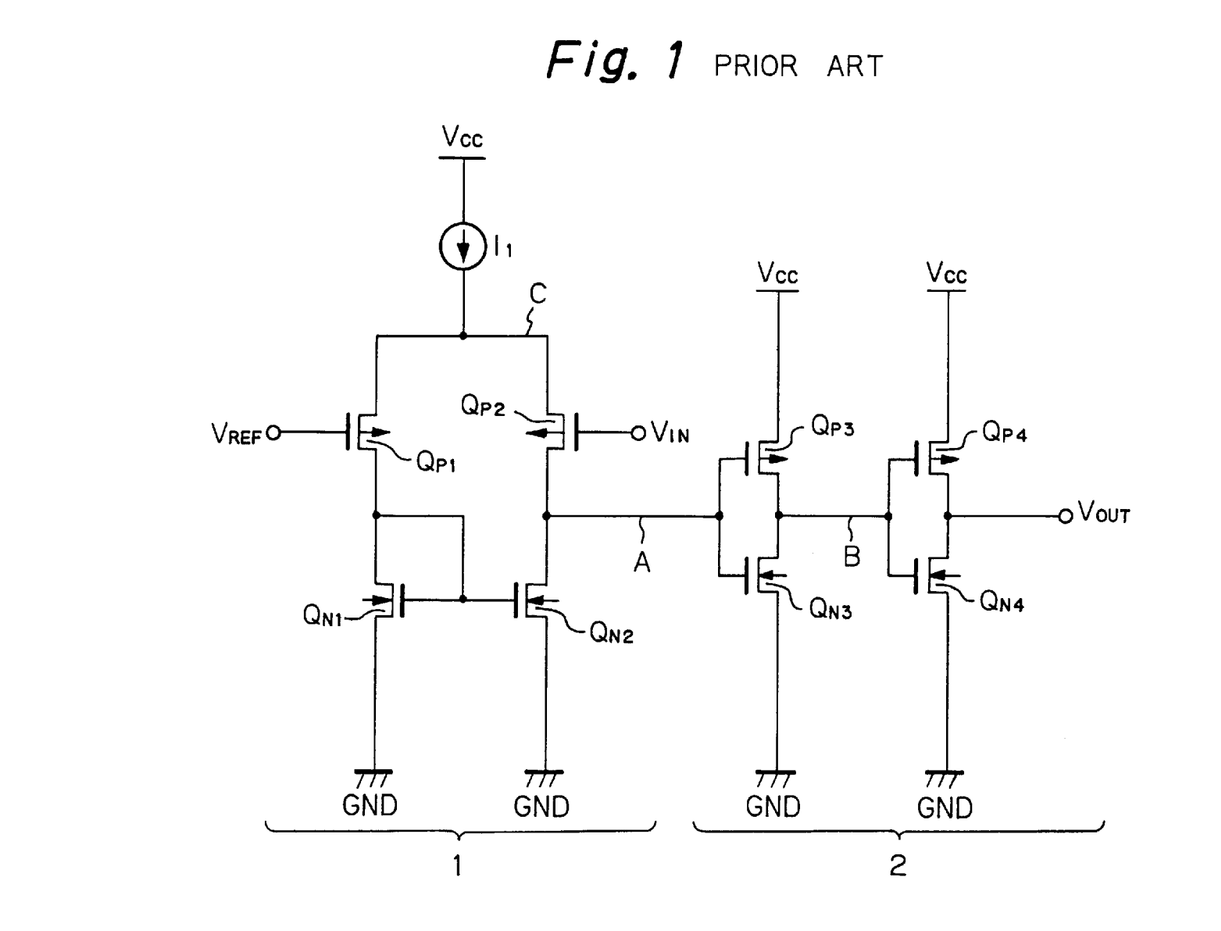
FIG. 1 is a circuit diagram illustrating a first prior art voltage monitoring circuit.

In FIG. 1, which illustrates a first prior art voltage monitoring circuit, reference numeral 1 designates a differential amplifier circuit for comparing an analog input voltage $V_{IN}$ with a reference voltage $V_{REF}$, and 2 designates a buffering circuit for outputting a digital output voltage $V_{OUT}$ in accordance with the output of the differential amplifier circuit 1.

The differential amplifier circuit 1 includes a constant current source $I_1$ connected to a power supply terminal $V_{cc}$, P-channel MOS transistors $Q_{P1}$ and $Q_{P2}$ as a current switch having sources connected to the constant current source $I_1$, and N-channel MOS transistors $Q_{N1}$ and $Q_{N2}$ as loads connected to a ground terminal GND. In this case, the gates of the transistors $Q_{N1}$ and $Q_{N2}$ are connected to the drain of the transistor $Q_{P1}$. Thus, the transistors $Q_{N1}$ and $Q_{N2}$ form a current mirror circuit.

The buffering circuit 2 includes two CMOS inverters in series. That is, a first stage is formed by a P-channel MOS transistor $Q_{P3}$ and an N-channel MOS transistor $Q_{N3}$ between the power supply terminal $V_{cc}$ and the ground terminal GND, and a second stage is formed by a P-channel MOS transistor $Q_{P4}$ and an N-channel MOS transistor $Q_{N4}$ between the power supply terminal $V_{cc}$ and the ground terminal GND.

Figure 2:
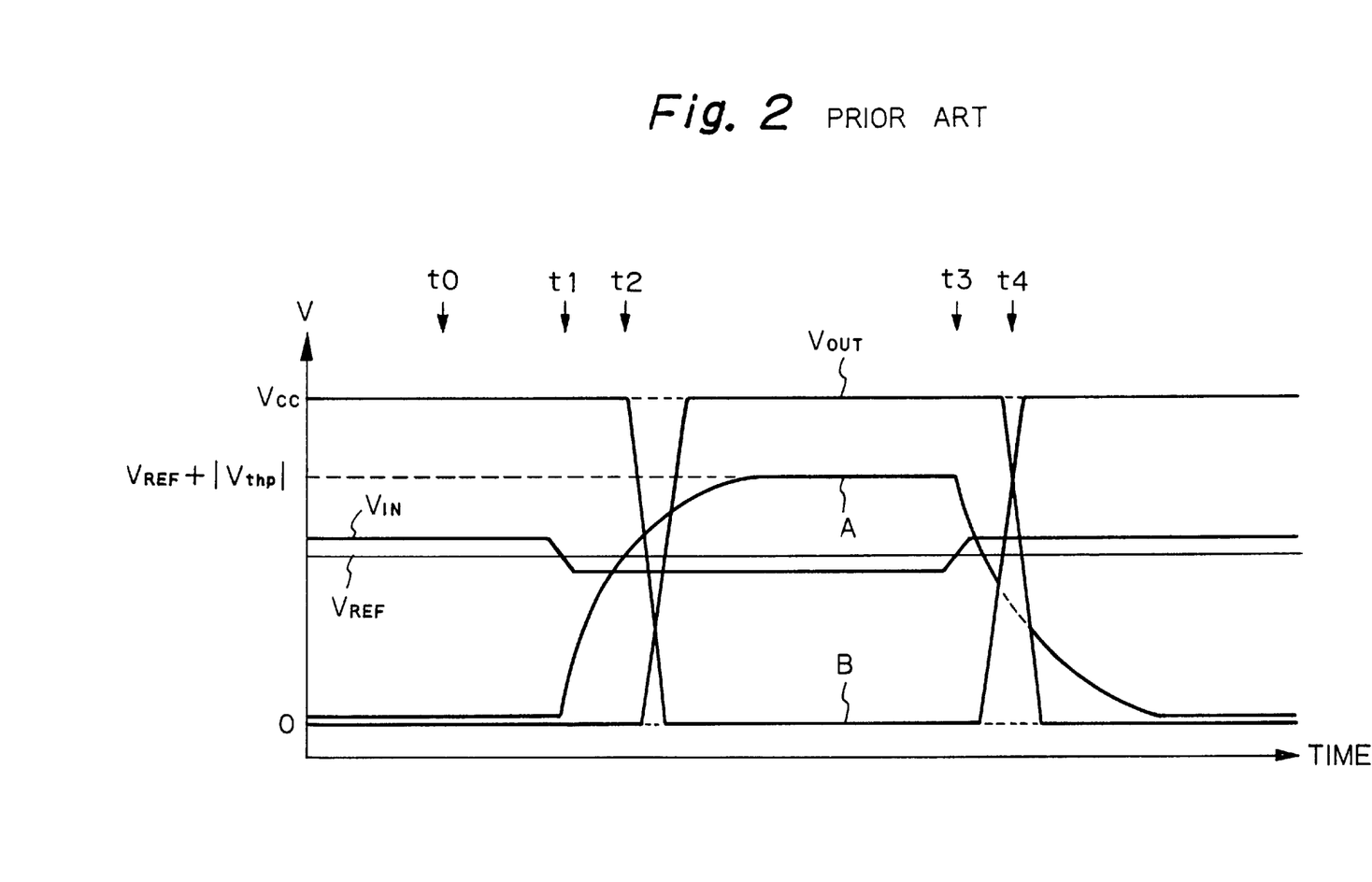
FIG. 2 is a timing diagram showing the operation of the circuit of FIG. 1.

The operation of the circuit of FIG. 1 is explained next with reference to FIG. 2.

At time t0, the input voltage $V_{IN}$ is higher than the reference voltage $V_{REF}$. Therefore, the transistors $Q_{P1}$ and $Q_{P2}$ are turned ON and OFF, respectively, so that the transistors $Q_{N1}$ and $Q_{N2}$ are in an ON stage. As a result, the voltage at a node A is low, and therefore, the voltage at a node B is high. Also, the output voltage $V_{OUT}$ is low.

Next, at time t1, when the input voltage $V_{IN}$ becomes lower than the reference voltage $V_{REF}$, the transistors $Q_{P1}$ and $Q_{P2}$ are turned OFF and ON, respectively, so that the transistor $Q_{N2}$ is turned OFF. As a result, the node A is charged via the transistor $Q_{P2}$ by the constant current source $I_1$, so that the voltage at the node A is increased.

At time t2, when the voltage at the node A becomes higher than a threshold voltage of the CMOS. inverter ($Q_{P3}$, $Q_{N3}$), the voltage at the node B is decreased to GND. As a result, the voltage $V_{OUT}$ of the CMOS inverter ($Q_{P4}$, $Q_{N4}$) is increased to $V_{cc}$.

In this state, note that the voltage at a node C of the sources of the transistors $Q_{P1}$ and $Q_{P2}$ is clamped at $$V_{REF}+|V_{thp}|$$

where $V_{thp}$ is a threshold of the P-channel MOS transistors. Therefore, the voltage at the node A is increased up to $V_{REF}+|V_{thp}|$, not $V_{cc}$. Thus, if $V_{REF}+|V_{thp}|<V_{cc}-|V_{thp}|$, the trasnsistor $Q_{P3}$ is still turned ON; in other words, a through current flows through the CMOS inverter ($Q_{P3}$, $Q_{N3}$).

In order to reduce the above-mentioned through current, the gate lengths of the transistors $Q_{P3}$ and $Q_{N3}$ are made larger, to suppress the current ability of the transistors $Q_{P3}$ and $Q_{N3}$.

Next, at time t3, when the input voltage $V_{In}$ becomes higher than the reference voltage $V_{REF}$, the transistors $Q_{P1}$ and $Q_{P2}$ are turned ON and OFF, respectively, so that the gate of the transistor $Q_{N2}$ is charged via the transistor $Q_{P1}$ by the constant current source $I_1$, so that the transistor $Q_{N2}$ is turned ON. Therefore, the voltage at the node A is decreased.

Finally, at time t4, when the voltage at the node A becomes lower than the threshold voltage of the CMOS inverter ($Q_{P3}$, $Q_{N3}$), the voltage at the node B is increased to $V_{cc}$. As a result, the voltage $V_{OUT}$ of the CMOS inverter ($Q_{P4}$, $Q_{N4}$) is decreased to GND.

In the first prior art voltage monitoring circuit as illustrated in FIG. 1, if the gate lengths of the transistors $Q_{P3}$ and $Q_{N3}$ are made larger, the sizes of the transistors $QP_3$ and $Q_{N3}$ are increased, which increases in input capacitance of the CMOS inverter ($Q_{P3}$, $Q_{N3}$). In addition, usually, since the driving power of the differential amplifier circuit 1 determined by the constant current source $I_1$ is very small, the changing speed of the voltage at the node A is very slow. Therefore, if the current ability of the transistors $Q_{P3}$ and $Q_{N3}$ is small, the changing speed of the voltage at the node B is further reduced. Thus, the response speed of the circuit of FIG. 1 is reduced.

Figure 3:
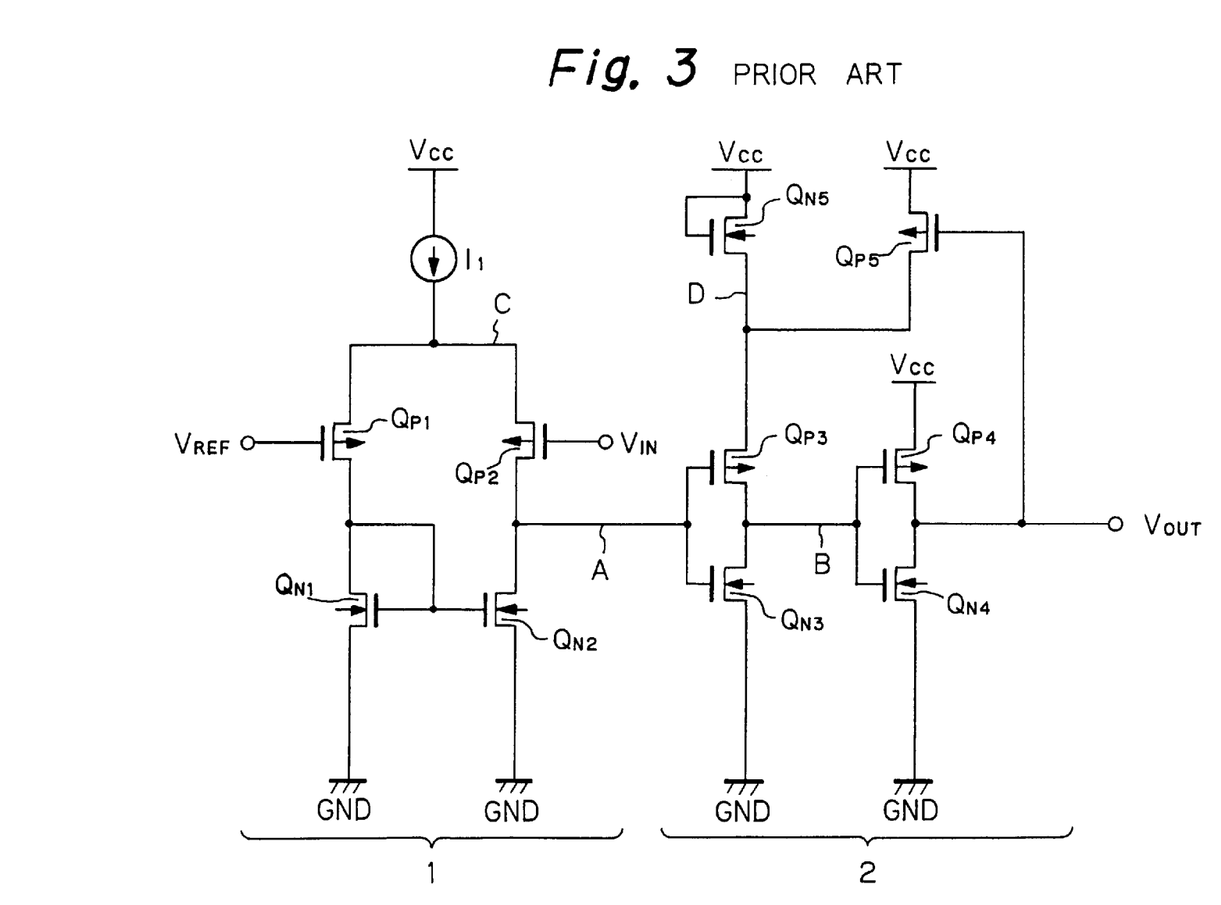
FIG. 3 is a circuit diagram illustrating a second prior art voltage monitoring circuit.

In FIG. 3, which illustrates a second prior art voltage monitoring circuit (see JP-A-6-152341), a diode-connected N-channel MOS transistor $Q_{N5}$ and a P-channel MOS transistor $Q_{P5}$ are added to the elements of FIG. 1. The transistors $Q_{N5}$ and $Q_{P5}$ are connected in parallel between the power supply terminal $V_{cc}$ and the source of the transistor $Q_{P3}$. Also, the output voltage $V_{OUT}$ is applied to a gate of the transistor $Q_{P5}$.

Figure 4:
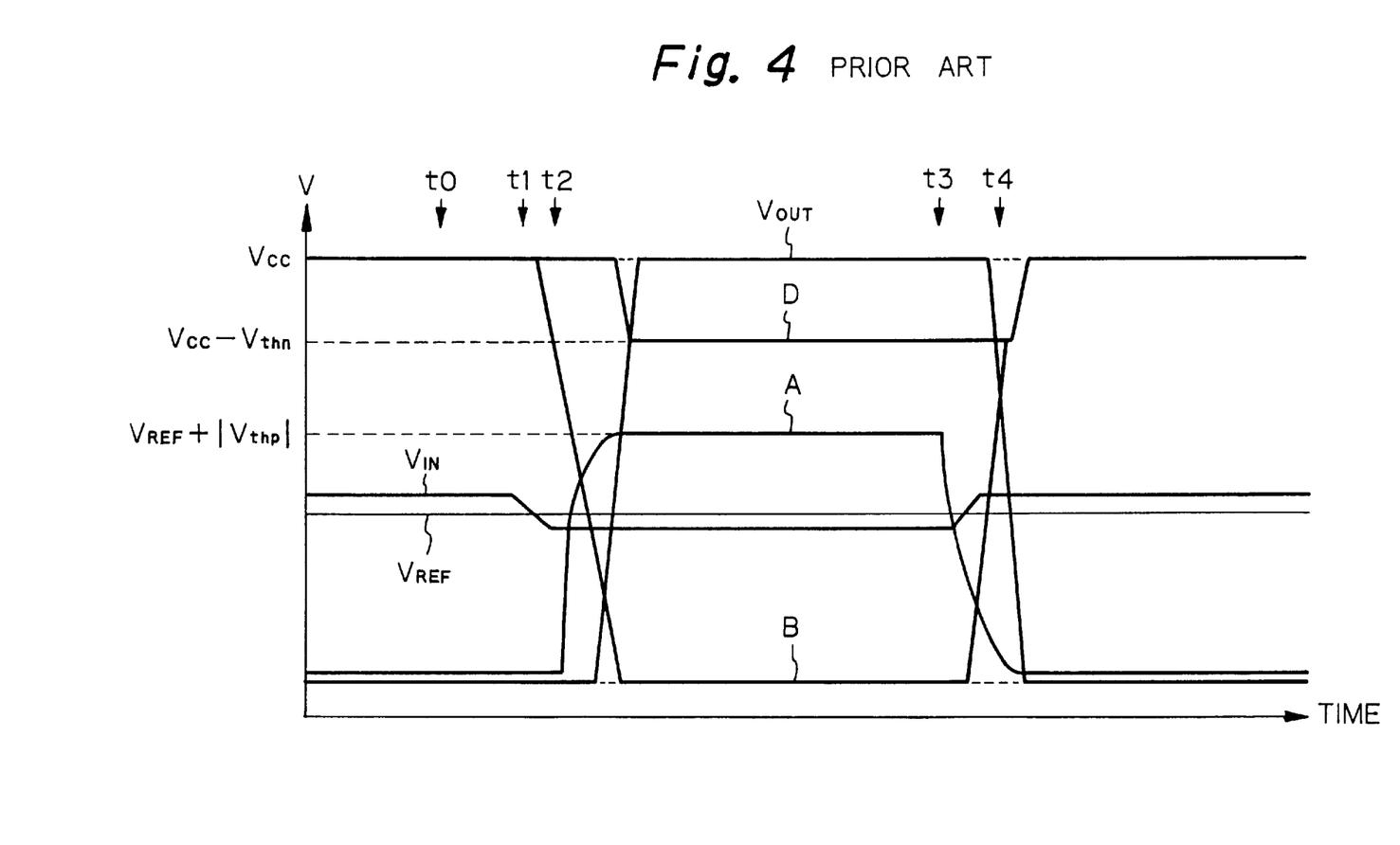
FIG. 4 is a timing diagram showing the operation of the circuit of FIG. 3.

The operation of the circuit of FIG. 3 is explained next with reference to FIG. 4.

At time t0, the input voltage $V_{IN}$ is higher than the reference voltage $V_{REF}$. Therefore, the transistors $Q_{P1}$ and $Q_{P2}$ are turned ON and OFF, respectively, so that the transistors $Q_{N1}$ and $Q_{N2}$ are in an ON state. As a result, the voltage at the node A is low, and therefore, the voltage at the node B is high. Also, the output voltage $V_{OUT}$ is low. In this case, the voltage at a node D is $V_{cc}$, since the transistor $Q_{P5}$ is turned ON by the output voltage $V_{OUT}$.

Next, at time t1, when the input voltage $V_{IN}$ becomes lower than the reference voltage $V_{REF}$, the transistors $Q_{P1}$ and $Q_{P2}$ are turned OFF and ON, respectively, so that the transistor $Q_{N2}$ is turned OFF. As a result, the node A is charged via the transistor $Q_{P2}$ by the constant current source $I_1$, so that the voltage at the node A is increased.

At time t2, when the voltage at the node A becomes higher than the threshold voltage at the CMOS inverter ($Q_{P3}$, $Q_{N3}$), the voltage at the node B is decreased to GND. As a result, the voltage $V_{OUT}$ of the CMOS inverter ($Q_{P4}$, $Q_{N4}$) is increased to $V_{cc}$.

In this state, the transistor $Q_{P5}$ is turned OFF by the output voltage $V_{OUT}$, and therefore, the voltage at the node D is $$V_{cc}-V_{thn} \quad (1)$$

where $V_{thn}$ is a threshold voltage of the N-channel MOS transistors. On the other hand, the voltage at the node A is $$V_{REF}+|V_{thp}| \quad (2)$$

From the formulae (1) and (2), the source-gate voltage of the transistor $Q_{P3}$ is $$V_{cc}-V_{thn}-(V_{REF}+|V_{thp}|) \quad (3)$$

In order to completely turn OFF the transistor $Q_{P3}$ to cut OFF a through current, the following condition needs to be satisfied:

$$V_{cc} - V_{thn} - (V_{REF} + |V_{thp}|) < |V_{thp}| \quad (4)$$
$$\therefore V_{cc} < V_{REF} + V_{thn} + 2|V_{thp}|$$
$$= V_{REF} + 3V_{th}$$

where $V_{thn} = -V_{thp} = V_{th}$.

Next, at time t3, when the input voltage $V_{IN}$ becomes higher than the reference voltage $V_{REF}$, the transistors $Q_{P1}$ and $Q_{P2}$ are turned ON and OFF, respectively, so that the gate of the transistor $Q_{N2}$ is charged via the transistor $Q_{P1}$ by the constant current source $I_1$, so that the transistor $Q_{N2}$ is turned ON. Therefore, the voltage at the node A is decreased.

Finally, at time t4, when the voltage at the node A becomes lower than the threshold voltage of the CMOS inverter ($Q_{P3}$, $Q_{N3}$), the voltage at the node B is increased to $V_{cc}$. As a result, the voltage $V_{OUT}$ of the CMOS inverter ($Q_{P4}$, $Q_{N4}$) is decreased to GND. Also, in this case, the voltage at the node D is recovered to $V_{cc}$, since the transistor $Q_{P5}$ is turned ON by the output voltage $V_{out}$.

Thus, in the voltage monifoing circuit as illustrated in FIG. 3, since the gate lengths of the transistors $Q_{P3}$ and $Q_{N3}$ do not need to be larger, the input capacitance of the CMOS inverter ($Q_{P3}$, $Q_{N3}$) can be reduced, which increases the response speed of the circuit of FIG. 3.

In the second prior art voltage monitoring circuit as illustrated in FIG. 3, however, if the abovementioned condition represented by the formula (4) is not satisfied, the through current flows through the CMOS inverter ($Q_{P3}$, $Q_{N3}$), which increases the power dissipation. For example, if the amplitude of the voltage at the node A is very small so that the high level of the voltage at the node A is too low, the condition (4) may be satisfied.

In order to effectively satisfy the condition (4), the number of diode-connected N-channel MOS transistors such as $Q_{N5}$ connected in series between the power supply terminal $V_{cc}$ and the node D may be increased, so that the low level of the voltage at the node D is decreased. In this case, however, the high level of the voltage at the node B is also decreased. At worst, the high level of the voltage at the node B cannot turn ON the transistor $Q_{N4}$.

Figure 5:
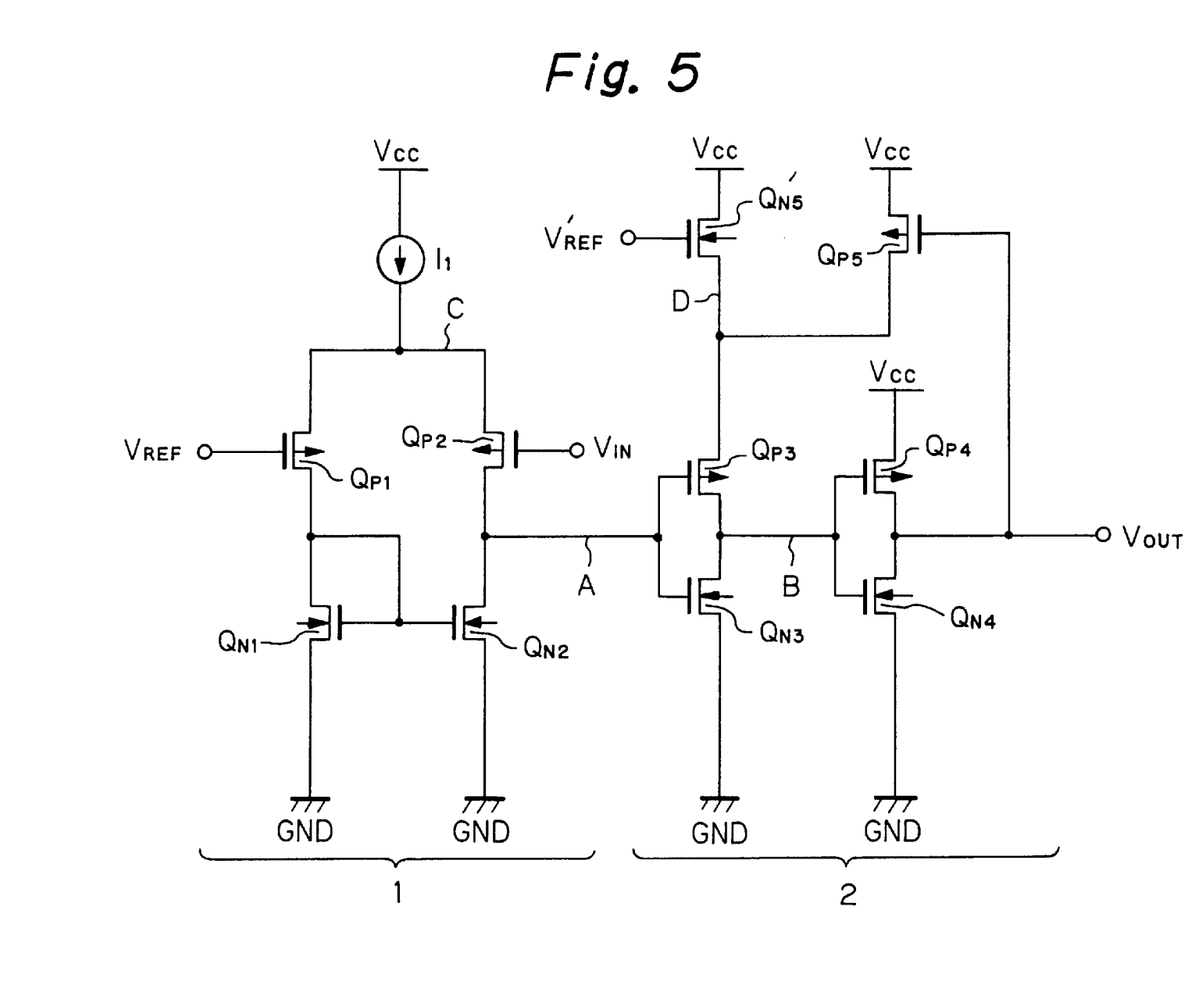
FIG. 5 is a circuit diagram illustrating an embodiment of the voltage monitoring circuit according to the present invention.

In FIG. 5, which illustrates an embodiment of the present invention, a source-follower-type N-channel MOS transistor $Q_{N5}'$ is provided instead of the diode-connected N-channel MOS transistor $Q_{N5}$ of FIG. 3. That is, a reference voltage $V_{REF}'$ ($>V_{REF}$) is applied to the gate of the transistor $Q_{N5}'$.

Figure 6:
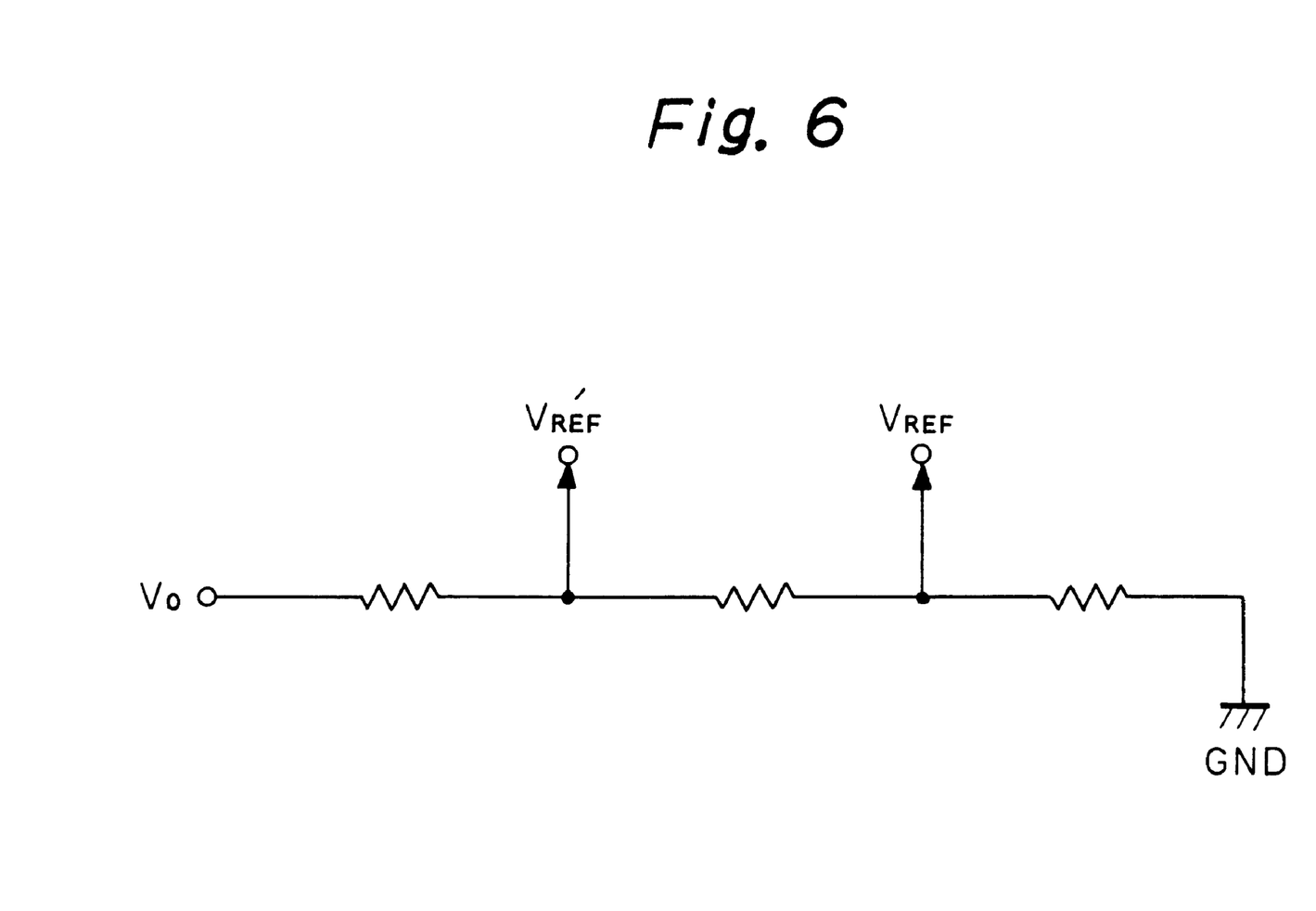
FIG. 6 is a circuit diagram of a voltage divider for generating the voltages of FIG. 5.

The reference voltages $V_{REF}$ and $V_{REF}'$ can be generated by a voltage divider circuit as illustrated in FIG. 6. In this case, a voltage $V_0$ is independent of $V_{cc}$ or less dependent on $V_{cc}$.

Figure 7:
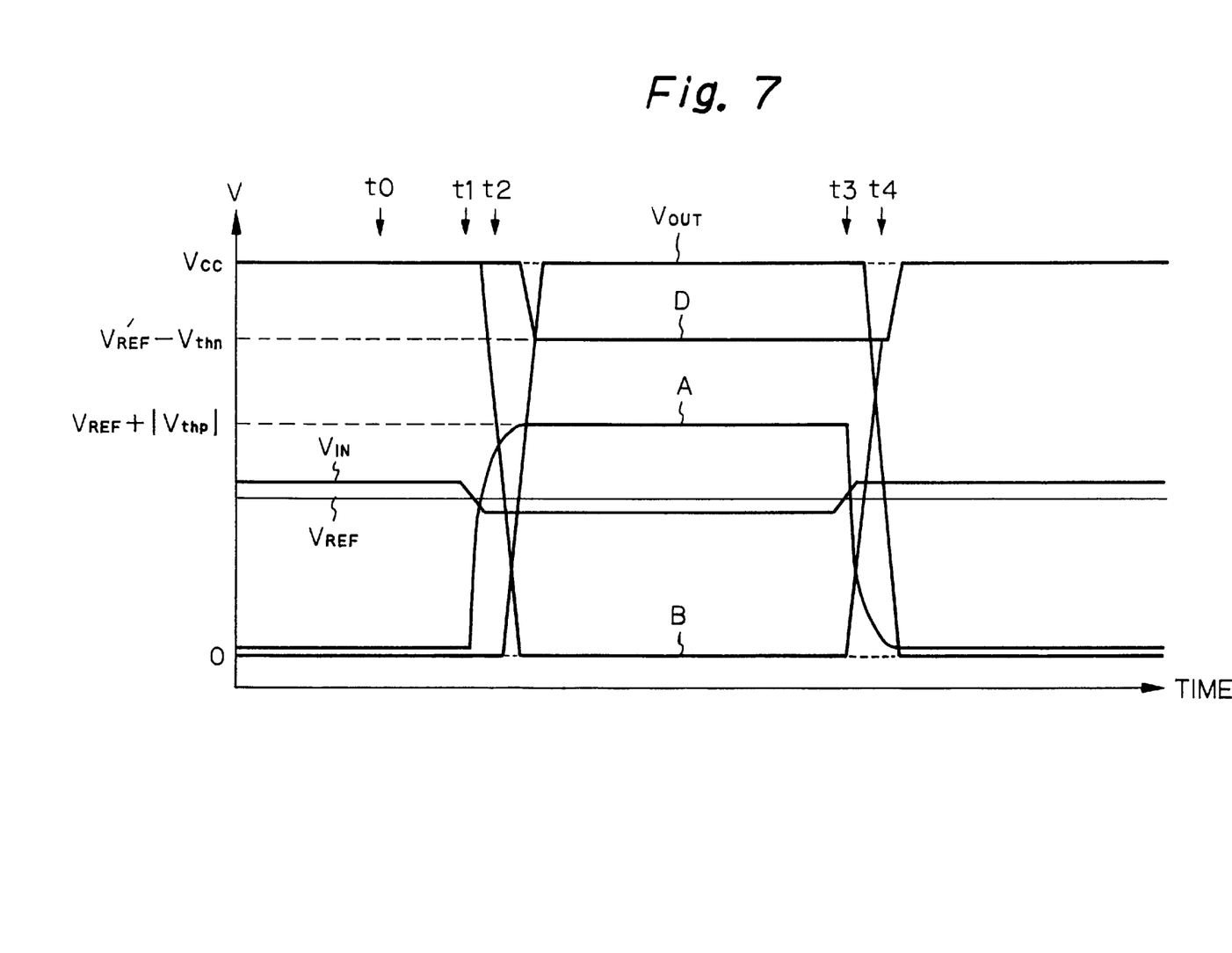
FIG. 7 is a timing diagram showing the operation of the circuit of FIG. 5.

The operation of the circuit of FIG. 5 is explained next with reference to FIG. 7.

At time t0, the input voltage $V_{IN}$ is higher than the reference voltage $V_{REF}$. Therefore, the transistors $Q_{P1}$ and $Q_{P2}$ are turned ON and OFF, respectively, so that the transistors $Q_{N1}$ and $Q_{N2}$ are in an ON state. As a result, the voltage at the node A is low, and therefore, the voltage at the node B is high. Also, the output voltage $V_{OUT}$ is low. In this case, the voltage at a node D is $V_{cc}$, since the transistor $Q_{P5}$ is turned ON by the output voltage $V_{OUT}$.

Next, at time t1, when the input voltage $V_{IN}$ becomes lower than the reference voltage $V_{REF}$, the transistors $Q_{P1}$ and $Q_{P2}$ are turned OFF and ON, respectively, so that the transistor $Q_{N2}$ is turned OFF. As a result, the node A is charged via the transistor $Q_{P2}$ by the constant current source $I_1$, so that the voltage at the node A is increased.

A time t2, when the voltage at the node A becomes higher than the threshold voltage of the CMOS inverter ($Q_{P3}$, $Q_{N3}$), the voltage at the node B is decreased to GND. As a result, the voltage $V_{OUT}$ of the CMOS inverter ($Q_{P4}$, $Q_{N4}$) is increased to $V_{cc}$.

In this state, the transistor $Q_{P5}$ is turned OFF by the output voltage $V_{OUT}$, and therefore, the voltage at the node D is $$V_{REF}' - V_{thn} \quad (5)$$

On the other hand, the voltage at the node A is $$V_{REF} + |V_{thp}| \quad (6)$$

From the formulae (5) and (6), the source-gate voltage of the transistor $Q_{P3}$ is $$V_{REF}' - V_{thn} - (V_{REF} + |V_{thp}|) \quad (7)$$

In order to completely turn OFF the transistor $Q_{P3}$ to cut OFF a through current, the following condition needs to be satisfied:

$$V_{REF}' - V_{thn} - (V_{REF} + |V_{thp}|) < |V_{thp}| \quad (8)$$
$$\therefore V_{REF}' < V_{REF} + V_{thn} + 2|V_{thp}|$$
$$= V_{REF} + 3V_{th}$$

where $V_{thn} = -V_{thp} = V_{th}$.

The condition represented by the formula (8) is not dependent upon $V_{cc}$. For example, the voltage divider as illustrated in FIG. 6 can generate the voltages $V_{REF}$ and $V_{REF}'$ satisfying the formula (8).

Next, at time t3, when the input voltage $V_{IN}$ becomes higher than the reference voltage $V_{REF}$, the transistors $Q_{P1}$ and $Q_{P2}$ are turned ON and OFF, respectively, so that the gate of the transistor $Q_{N2}$ is charged via the transistor $Q_{P1}$ by the constant current source $I_1$, so that the $Q_{N2}$ is turned ON. Therefore, the voltage at the node A is decreased.

Finally, at time t4, when the voltage at the node A becomes lower than the threshold voltage of the CMOS inverter ($Q_{P3}$, $Q_{N3}$), the voltage at the node B is increased to $V_{cc}$. As a result, the voltage $V_{OUT}$ of the CMOS inverter ($Q_{P4}$, $Q_{N4}$) is decreased to GND. Also, in this case, the voltage at the node D is recovered to $V_{cc}$, since the transistor $Q_{P5}$ is turned ON by the output voltage $V_{out}$.

Thus, in the above-described embodiment, since the gate lengths of the transistors $Q_{P3}$ and $Q_{N3}$ do not need to be larger, the input capacitance of the CMOS inverter ($Q_{P3}$, $Q_{N3}$) can be reduced, which increases the response speed. In addition, if the above-mentioned condition represented by the formula (8) is satisfied, the through current flowing through the CMOS inverter ($Q_{P3}$, $Q_{N3}$) can be cut, which decreases the power dissipation.

As explained hereinabove, according to the present invention, the through current can be cut independent of the power supply voltage, thus decreasing the power dissipation.

I claim:

1. A buffering circuit comprising:

first and second power supply terminals;

a node;

a CMOS inverter connected between said node and said second power supply terminal and having a common gate connected to an input of said buffering circuit;

a source-follower-type MOS transistor connected between said first power supply terminal and said node, a gate of said source-follower-type MOS transistor receiving a reference voltage independent of a voltage at said first power supply terminal;

a MOS transistor connected in parallel to said source-follower-type MOS transistor, a gate of said MOS transistor receiving an inverted signal of an output signal of said CMOS inverter.

2. The buffering circuit as set forth in claim 1, wherein said CMOS inverter is subjected to a voltage generated by said source-follower-type MOS transistor when an input signal to said CMOS inverter is a first level, said CMOS inverter being subjected to a voltage at said first power supply terminal when an input signal to said CMOS inverter is a second level.

3. A buffering circuit comprising:

first and second power supply terminals;

a CMOS inverter for receiving an input signal to output an output signal, said CMOS inverter including a first MOS transistor of a first conductivity type and a second MOS transistor of a second conductivity type connected between said first MOS transistor and said second power supply terminal;

a third MOS transistor of said second conductivity type connected between said first power supply terminal and said first MOS transistor, a gate of said third MOS transistor receiving a reference voltage independent of a voltage at said first terminal; and a fourth MOS transistor of said first conductivity type connected between said first power supply terminal and said first MOS transistor, a gate of said third MOS transistor receiving an inverted signal of said output signal.

4. The buffering circuit as set forth in claim 3, wherein said CMOS inverter is subjected to a voltage generated by said third MOS transistor when said input signal is a first level, said CMOS inverter being subjected to a voltage at said first power supply terminal when said input signal is a second level.

5. A voltage monitoring circuit comprising:

first and second power supply terminals;

a node;

a MOS differential amplifier, connected between said first and second power supply terminals, for receiving an input voltage and a first reference voltage to generate a first voltage in response to a difference between said input voltage and said first reference voltage;

a first CMOS inverter connected to said MOS differential amplifier and between said node and said second power supply terminal;

a second CMOS inverter connected to said first CMOS inverter and between said first and second power supply terminals, for outputting an output voltage;

a source-follower-type MOS transistor connected between said first power supply terminal and said node, a gate of said source-follower-type MOS transistor receiving a second reference voltage independent of a voltage at said first power supply terminal;

a MOS transistor connected in parallel to said source-follower-type MOS transistor, a gate receiving said output voltage.

6. The voltage monitoring circuit as set forth in claim 5, further comprising a voltage divider for generating said first and second reference voltages.

7. The voltage monitoring circuit as set forth in claim 5, wherein said first CMOS inverter is subjected to a voltage generated by said source-follower-type MOS transistor when said output voltage is a first level, said CMOS inverter being subjected to a voltage at said first power supply terminal when said output voltage is a second level.

8. The voltage monitoring circuit as set forth in claim 5, wherein said source-follower-type MOS transistor is of an N-channel type and said MOS transistor is of a p-channel type.

9. A voltage monitoring circuit comprising:

first and second power supply terminals;

a node;

a MOS differential amplifier, connected between said first and second power supply terminals, for receiving an input voltage and a first reference voltage to generate a first voltage in response to a difference between said input voltage and said first reference voltage;

a first CMOS inverter connected to said MOS differential amplifier and between said node and said second power supply terminal and including a first MOS transistor of a first conductivity type and a second MOS transistor of a second conductivity type;

a second CMOS inverter connected to said first CMOS inverter and between said first and second power supply terminals, for outputting an output voltage, said CMOS inverter including a third MOS transistor of said first conductivity type and a fourth MOS transistor of said second conductivity type;

a fifth MOS transistor of said second conductivity type connected between said first power supply terminal and said node, a gate of said fifth MOS transistor receiving a second reference voltage independent of a voltage at said first power supply terminal;

a sixth MOS transistor of said first conducivity type connected in parallel to said fifth MOS transistor, a gate receiving said output voltage.

10. The voltage monitoring circuit as set forth in claim 9, further comprising a voltage divider for generating said first and second reference voltages.

* * * * *